(12) United States Patent
Kim

(10) Patent No.: US 8,373,169 B2
(45) Date of Patent: Feb. 12, 2013

(54) THIN FILM TRANSISTOR OF LIQUID CRYSTAL DISPLAY DEVICE WITH SPECIFIED CHANNEL W/L RATIO

(75) Inventor: Pyung Hun Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/158,028

(22) Filed: Jun. 22, 2005

(65) Prior Publication Data

US 2005/0285196 A1   Dec. 29, 2005

(30) Foreign Application Priority Data

Jun. 25, 2004   (KR) .................. 10-2004-0047948

(51) Int. Cl.
    *H01L 29/786* (2006.01)
(52) U.S. Cl. .......................... 257/72; 438/149
(58) Field of Classification Search ............ 257/72, 257/66, 347, E31.041; 438/149
    See application file for complete search history.

(56) References Cited

U.S. PATENT DOCUMENTS

| | | | | |
|---|---|---|---|---|
| 4,870,399 A * | 9/1989 | Carlson | .......... | 345/55 |
| 5,177,406 A * | 1/1993 | Troxell | .......... | 315/169.1 |
| 5,398,043 A * | 3/1995 | Takeda et al. | .......... | 345/94 |
| 5,539,219 A * | 7/1996 | den Boer et al. | .......... | 257/59 |
| 5,672,888 A * | 9/1997 | Nakamura | .......... | 257/72 |
| 5,691,786 A * | 11/1997 | Nakai | .......... | 349/39 |
| 5,737,049 A * | 4/1998 | Shin et al. | .......... | 349/122 |
| 5,872,370 A * | 2/1999 | Gu et al. | .......... | 257/66 |
| 5,917,199 A * | 6/1999 | Byun et al. | .......... | 257/59 |
| 6,016,174 A * | 1/2000 | Endo et al. | .......... | 349/43 |
| 6,198,464 B1 * | 3/2001 | Ota et al. | .......... | 345/77 |
| 6,218,206 B1 * | 4/2001 | Inoue et al. | .......... | 438/30 |
| 6,429,456 B1 * | 8/2002 | Takechi et al. | .......... | 257/59 |
| 6,489,940 B1 * | 12/2002 | Aoki | .......... | 345/93 |
| 6,671,019 B1 * | 12/2003 | Petschek et al. | .......... | 349/129 |
| 6,777,716 B1 * | 8/2004 | Yamazaki et al. | .......... | 257/88 |
| 2003/0007107 A1 * | 1/2003 | Chae et al. | .......... | 349/43 |
| 2003/0117535 A1 * | 6/2003 | Park et al. | .......... | 349/39 |
| 2003/0193625 A1 * | 10/2003 | Yoshida et al. | .......... | 349/43 |
| 2004/0114059 A1 | 6/2004 | Lee et al. | | |
| 2004/0195571 A1 * | 10/2004 | Ahn et al. | .......... | 257/72 |
| 2006/0125363 A1 * | 6/2006 | Tahira et al. | .......... | 313/29 |
| 2006/0132411 A1 * | 6/2006 | Kim et al. | .......... | 345/92 |
| 2007/0059438 A1 * | 3/2007 | Ong | .......... | 427/58 |

FOREIGN PATENT DOCUMENTS

| | | |
|---|---|---|
| KR | 10-2002-0032580 A | 5/2002 |
| KR | 2004-0050311 A | 6/2004 |

* cited by examiner

*Primary Examiner* — Tom Thomas
*Assistant Examiner* — Christopher M Roland
(74) *Attorney, Agent, or Firm* — McKenna Long & Aldridge LLP

(57) ABSTRACT

A thin film transistor serving as a switching device provided in respective pixels of an active matrix-type liquid crystal display, the thin film transistor including a source electrode overlapping the gate electrode, a first semiconductor layer and contacting one of the two parts of a second impurity semiconductor layer, and a drain electrode overlapping the gate electrode, the first semiconductor layer and contacting another one of the two parts of the second semiconductor layer, wherein the source and drain electrode define a channel region in the first semiconductor layer having a length between the first and second portions of the first semiconductor layer and a width same as a width of at least one of the two parts of the second semiconductor layer such that a ratio of the width to the length (W/L) of the channel region is in a range of 8 through 10.

2 Claims, 4 Drawing Sheets

THIN FILM TRANSISTOR OF LIQUID CRYSTAL DISPLAY DEVICE WITH SPECIFIED CHANNEL W/L RATIO

The present invention claims the benefit of Korean Patent Application No. 47948/2004 filed in Korea on Jun. 25, 2004, which is hereby incorporated by reference in its entirety.

BACKGROUND OF THE INVENTION

1. Field of the Invention

The present invention relates to a liquid crystal display (LCD), and more particularly, to a thin film transistor (TFT) of an LCD device and a fabrication method thereof.

2. Description of the Related Art

Generally, an LCD operates using the optical anisotropy and the polarization of liquid crystal molecules. Since the liquid crystal molecules have an elongated thin structure, an arrangement of liquid crystal molecules having an orientation can be formed. The direction of the arrangement of liquid crystal molecules can be controlled by artificially applying an electric field. Therefore, it is possible to display image information by controlling the direction of the arrangement of the liquid crystal molecules so as to modulate light polarized by the optical anisotropy. Liquid crystal molecules can be classified into positive liquid crystal molecules having positive dielectric anisotropy and negative liquid crystal molecules having negative dielectric anisotropy according to their electrical characteristics. In the liquid crystal molecules having positive dielectric anisotropy, a longer axis of the liquid crystal molecule is aligned in parallel with the direction in which an electric field is applied. On the contrary, in liquid crystal molecules having negative dielectric anisotropy, a longer axis of the liquid crystal molecule is aligned in a direction perpendicular to the direction in which an electric field is applied.

An active matrix-type LCD includes pixel electrodes arranged in a matrix form that are connected with the TFTs. The active matrix-type LCD has a high resolution and an excellent moving-image displaying performance and is thus widely used. The structure of a liquid crystal panel, which is a part of a liquid crystal display device, will be described below.

FIG. 1 is an exploded perspective view of a related art LCD. Referring to FIG. 1, the related art LCD has a color substrate 7 including a black matrix 6, a color filter 8 having sub-color-filters (red, green, and blue), an upper substrate 5 and a transparent common electrode 18 on the color filter. The related art LCD also includes an array substrate 11 having a lower substrate 22 with gate lines 13 and data lines 15 that cross each other and define pixel regions P. Each pixel region P has a pixel electrode 17 and a switching device T, such as a TFT. The pixel electrode 17 is formed of transparent conductive metal having excellent light transmittance, such as indium-tin-oxide (ITO). The TFTs (T) are arranged in a matrix form on the array substrate and are formed adjacent to where the gate lines 13 and data lines 15 cross each other. Liquid crystal molecules 14 fill a space between the upper substrate 5 and the lower substrate 22.

In the above-described related art LCD, the liquid crystal molecules 14 disposed on the pixel electrode 17 are aligned by a signal applied through the TFT. Light passing through the liquid crystal layer is controlled according to the alignment degree of the liquid crystal layer, so that an image can be displayed. That is, the TFT performs the function of switching on and switching off the respective pixels of the related art LCD. To maintain good image quality, it is required that the TFTs have the same electrical characteristics as well as the same fast switching speed.

SUMMARY OF THE INVENTION

Accordingly, the present invention is directed to a TFT of an LCD and a fabrication method thereof that substantially obviate one or more problems due to limitations and disadvantages of the related art.

An object of the present invention is to provide a TFT for use in an active matrix-type LCD and a fabrication method thereof that prevent an indefinite spot of low temperature.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, A thin film transistor serving as a switching device provided in respective pixels of an active matrix-type liquid crystal display, the thin film transistor includes a gate electrode, a gate insulation layer on the gate electrode, a first semiconductor layer on the gate insulation layer, a second semiconductor layer divided into two parts facing each other on first and second portions of the first semiconductor layer, a source electrode overlapping the gate electrode, the first semiconductor layer and contacting one of the two parts of the second semiconductor layer, and a drain electrode overlapping the gate electrode, the first semiconductor layer and contacting another one of the two parts of the second semiconductor layer, wherein the source and drain electrode define a channel region in the first semiconductor layer having a length between the first and second portions of the first semiconductor layer and a width same as a width of at least one of the two parts of the second semiconductor layer such that a ratio of the width to the length (W/L) of the channel region is in a range of 8 through 10.

In another aspect of the present invention, there is provided a method of manufacturing a TFT including forming a gate electrode on a substrate, forming a gate insulation film over an entire surface of the substrate having the gate electrode thereon, forming a first semiconductor layer on the gate insulation layer, forming a second semiconductor layer divided into two parts facing each other on first and second portions of the first semiconductor layer, forming a source electrode overlapping the gate electrode, the first semiconductor layer and contacting one of the two parts of the second semiconductor layer, forming a drain electrode overlapping the gate electrode, the first semiconductor layer and contacting another one of the two parts of the second semiconductor layer, wherein the source and drain electrode define a channel region in the first semiconductor layer having a length between the first and second portions of the first semiconductor layer and a width same as a width of at least one of the two parts of the second semiconductor layer such that a ratio of the width to the length (W/L) of the channel region is in a range of 8 through 10.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE INVENTION

Reference will now be made in detail to the preferred embodiments of the present invention, examples of which are illustrated in the accompanying drawings.

Figure 1:
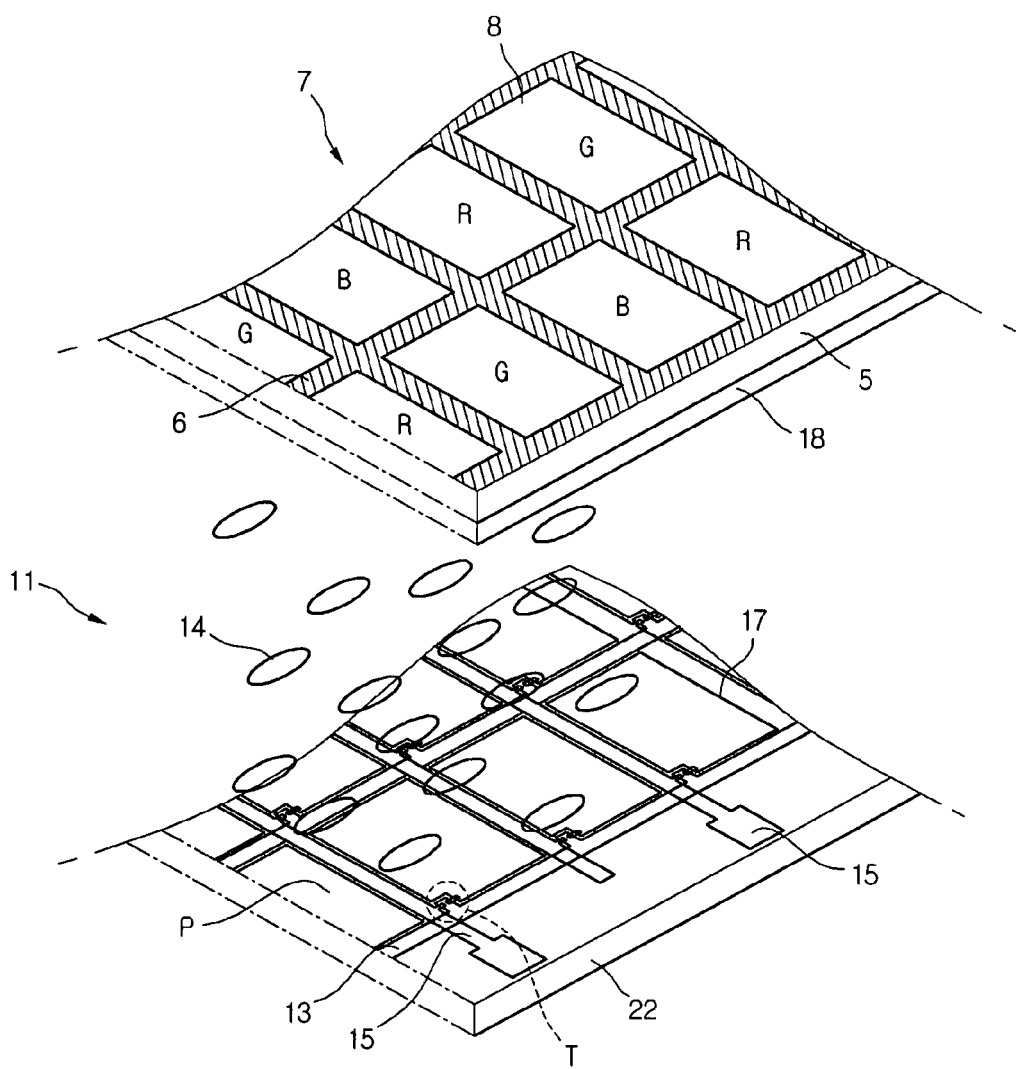
FIG. 1 is an exploded perspective view of part of a related art LCD.
Figure 2:
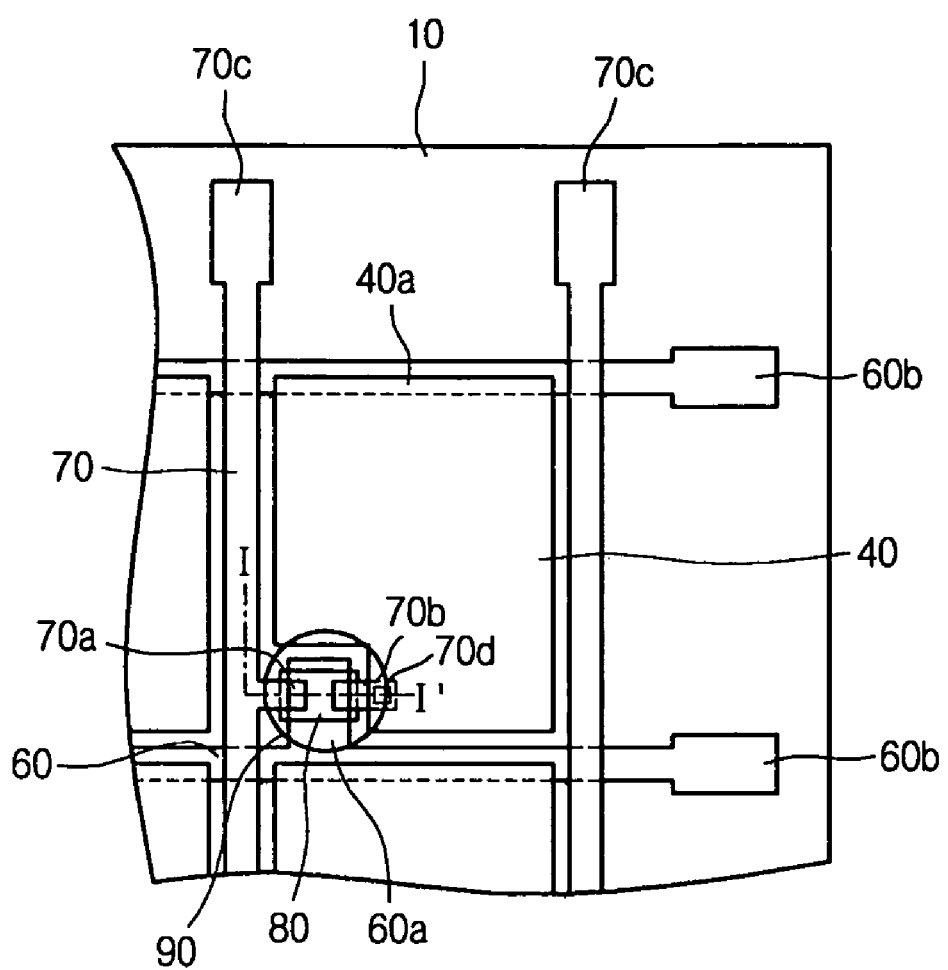
FIG. 2 is a schematic plan view of an array substrate for an LCD.
Figure 3:
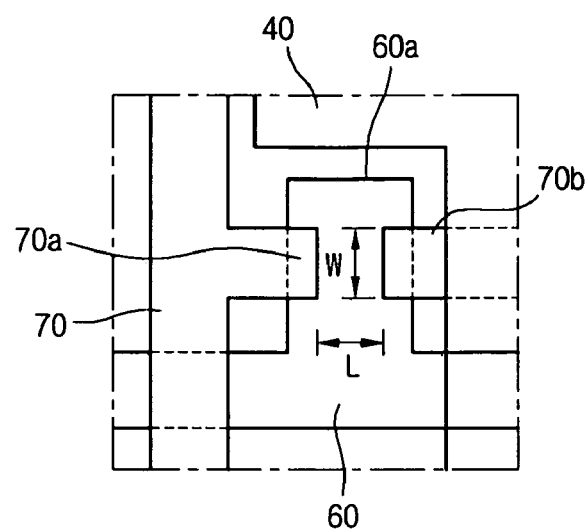
FIG. 3 is a partial enlarged view of the TFT of the pixel illustrated in FIG. 2.
Figure 4:
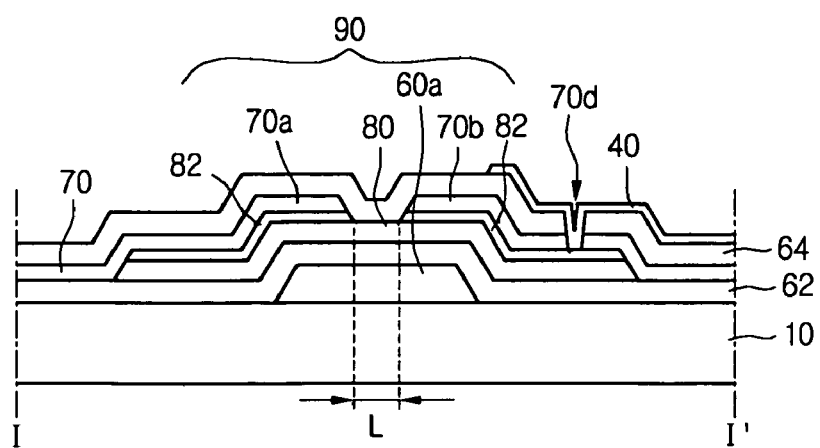
FIG. 4 is a cross-sectional view of a TFT taken along line I-I' of FIG. 2.

FIG. 2 is a schematic plan view of an array substrate for an LCD. FIG. 3 is a partial enlarged view of the TFT of the pixel illustrated in FIG. 2. FIG. 4 is a cross-sectional view of a TFT taken along line I-I' of FIG. 2.

Referring to FIGS. 2 and 3, an array substrate of an LCD has gate lines 60 and data lines 70 arranged on a transparent substrate 10. The gate lines 60 and the data lines 70 cross each other to define pixel regions. A TFT 90 includes a gate electrode 60a, a source electrode 70a, and a drain electrode 70b, and a semiconductor layer 80. Each TFT 90 of the array substrate is formed adjacent to where the gate lines 60 and the data lines 70 cross each other. A pixel electrode 40 contacting the drain electrode 70b through the drain contact hole 70d is formed in each of the pixel regions.

A gate pad 60b, which contacts a driving integrated circuit (IC) terminal, is formed at each end of the gate lines 60 and a data pad 70c is formed at each end of the data lines 70. An end of the pixel electrode 40 contacts the TFT 9 and the other end of the pixel electrode 40 disposed on the opposite side at least partially overlaps an adjacent gate line 60. A storage capacitance 40a is formed at the overlapped portion.

As shown in FIG. 4, the gate electrode 60a is formed on the substrate 10 and a gate insulation film 62 is formed over the entire surface of the substrate 10 having the gate electrode 60a. A silicon layer is deposited and patterned on the gate insulation film 62 to form a semiconductor layer 80. The source electrode 70a and the drain electrode 70b are formed on the semiconductor layer 80 to overlap a part of the gate electrode 60a and spaced apart by a predetermined interval L. A doped semiconductor layer 82 is formed between the semiconductor layer 80 and the source/drain electrodes 70a and 70b for better contact. The doped semiconductor layer 82 has a higher dopant concentration than the semiconductor layer 80. The interval L between the source electrode and the drain electrode is a length of the channel region in the semiconductor layer 80. The width of one of the source/drain electrodes 70a and 70b determines the width of the channel region, which is illustrated as W in FIG. 3.

Subsequently, a passivation layer 64 is formed over the entire surface of the substrate having the source electrode 70a and the drain electrode 70b. A contact hole is formed in a predetermined region of the passivation layer 64 on the drain electrode 70b. The pixel electrode 40 is formed on the passivation layer 64 and into the contact hole to be electrically connected with the drain electrode 70b.

The present invention is characterized in that a W/L value of the channel region is in a range of 8-10 and a value of the storage capacitance ($C_{ST}$) of each of the pixels is 200 fF so as to overcome an indefinite spot of low temperature occurring in the TFT for use in an active matrix-type LCD. Construction and operation of the TFT 90 will be described below in more detail.

The TFT 90 includes the gate electrode 60a for controlling turn on/off of the TFT 90, a gate insulation layer 62 on the gate electrode 60a, a semiconductor layer 80 on the gate insulation layer 62, an impurity-semiconductor layer 82 divided into two parts facing each other defining a channel region of the semiconductor layer 80, a source electrode 70a and a drain electrode 70b. The source electrode 70a overlaps the gate electrode 60a, the semiconductor layer 80 and one of the doped semiconductor layers 82. The drain electrode 70b overlaps the gate electrode 60a, the semiconductor layer 80 and one of the doped semiconductor layers 82

In operation, when an external voltage is sequentially applied according to a time sequence and transferred to the gate lines, a signal voltage representing image information that is on the data lines 70 is transferred from the source electrode 70a to the drain electrode 70b (turn-on of the transistor). Subsequently, the signal voltage is transferred to the pixel electrode 40 through a drain contact hole 70d. On the contrary, when the external voltage is not applied to the gate lines 60, the source electrode 70a and the drain electrode 70b are not connected (turn-off of the transistor). In the manner, the TFT 90 acts as a switching device.

After the external voltage is applied to the n-th gate line 60 according to time sequence, the external voltage is applied to the (n+1)th gate line 60 and simultaneously supply of the voltage that had been applied to the n-th gate line 60 is cut off. After a voltage is applied up to the last gate line 60 in this manner, a voltage is sequentially applied again to the gate lines 60 from the first gate line 60 to the last gate line 60. The pixel electrode 40 should hold image information data that was transmitted when the TFT 90 had been turned on until a new signal is applied, such as after one frame elapses. Thus, a liquid crystal drive voltage is applied from the data line 70 to across the liquid crystal molecules by way of the drain and source electrodes of the TFT and held by a pixel capacitance, which is a sum of a liquid crystal capacitance $C_{LC}$ and a storage capacitance $C_{ST}$ of the pixel electrode 40 overlapping an adjacent gate line 60.

The above operation is repeated, so that a voltage is repeatedly applied to the pixel capacitance of each pixel of the entire surface of the LC panel in response to image signals. Resultantly, when a pixel is switched on by the TFT, the switched-on pixel can transmit light from a lower light source.

When a predetermined voltage is applied to the gate electrode 60a and the TFT is turned on, a current $I_{DS}$ is transferred from the data lines to the pixel electrode 40 of each pixel in accordance with the following equation [1]:

$$I_{DS}=K(V-|V_{TH}|)^2 \qquad [1]$$

where V is a voltage applied to each pixel through the data line 70, $V_{TH}$ is a threshold voltage of the TFT, and K is a current gain value.

$$K=\tfrac{1}{2}\times W/L \times \mu \times Cg. \qquad [2]$$

Here, W is the width of the TFT channel as illustrated in FIG. 3, L is the length of the TFT channel. Also, μ is a mobility of a charge, and $C_g$ is a parasitic capacitance generated at the overlapped portions between the gate electrode 60a and the source electrode 70a, and the gate electrode 60a and the drain electrode 70b.

$I_{DS}$ is a current for displaying an image through each pixel. As the $I_{DS}$ increases, image quality is enhanced. Therefore, the K value can be increased so as to increase the $I_{DS}$. Thus, the ratio of the width W to the length of the TFT channel (W/L) should be increased. However, when the W/L increases, the overlapped portions between the gate electrode 60a and the source electrode 70a, and the gate electrode 60a and the drain electrode 70b increase, so that a parasitic capacitance increases and an aperture ratio of the display decreases.

When the parasitic capacitance Cg of the TFT increases, the time needed for the pixel electrode 40 to be charged with a voltage is increased. Thus, a charging delay is created. Also, since the parasitic capacitance Cg can cause a voltage change $\Delta V_p$ to the liquid crystal voltage $V_{LC}$ by capacitive coupling when the TFT is turned off, image quality can deteriorate. Thus, the parasitic capacitance $C_g$ of the TFT should be considered in designing the TFT. $\Delta V_p$ is given by the following equation [3]:

$$\Delta V_p = \frac{C_g}{C_g + C_{LC} + C_{ST}} \Delta V_g,  \quad [3]$$

where Cg is parasitic capacitance, $C_{LC}$ is liquid crystal capacitance, and $C_{ST}$ is storage capacitance. Also, assuming that the gate voltages of on/off states are Vgh and Vgl, respectively, $\Delta V_g$ is a difference between Vgh and Vgl. When $\Delta V_p$ is generated, a phenomenon of screen shaking occurs due to blinking during driving of the screen, that is, a flicker is generated.

To overcome the above problems, the parasitic capacitance $C_g$ can be decreased and the storage capacitance $C_{ST}$ can be increased. This can be achieved by expanding the portion where the end of the pixel electrode 40 overlaps with part of the adjacent gate line 60 (refer to FIG. 2). In the design of the TFT of a related art, the W/L is designed with consideration of the parasitic capacitance $C_g$ and the aperture ratio and the storage capacitance $C_{ST}$ has been increased on the basis of the foregoing. That is, in the case of a 15-inch XGA panel (pixel size is 99*297 μm), the W/L is about 7, the $C_{ST}$ is about 230 fF, and the $C_g$ is about 651 pF according to the design of the related art.

The related art TFT structure cannot prevent an indefinite spot of low temperature. The indefinite spot of low temperature occurs when only a fraction of display current $I_{DS}$ is applied to the respective pixel electrodes when the LCD is under a low temperature condition. As a result, an indefinite spot is locally generated, which will be described with reference to FIGS. 5A and 5B.

Figure 5A:
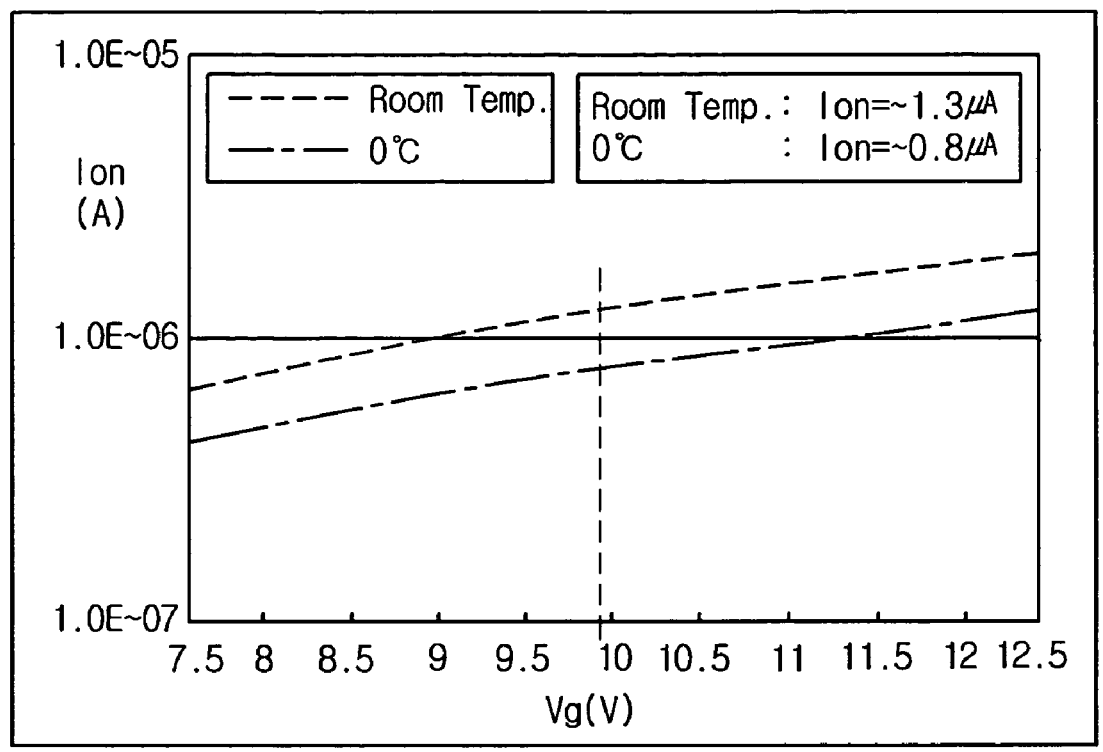
FIGS. 5A and 5B are views explaining an indefinite spot of low temperature.
Figure 5B:
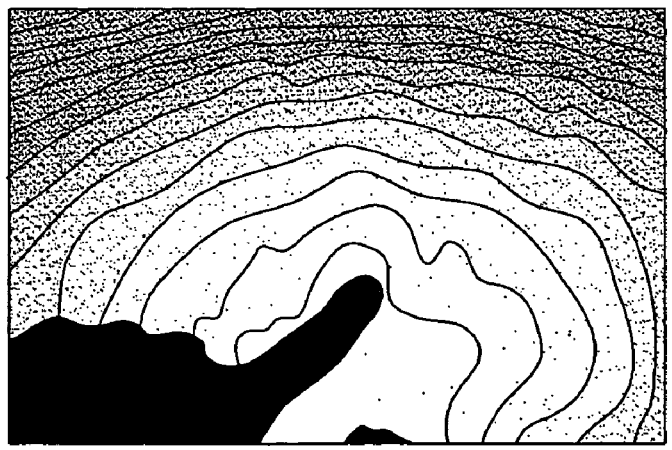

FIGS. 5A and 5B are views explaining an indefinite spot of low temperature. FIG. 5A is a graph comparing a current $I_{DS}$ applied to the respective pixel electrodes at room temperature and 0° C., and FIG. 5B is a photo of a display screen on which the indefinite spot of low temperature appears. To prevent the indefinite spot of low temperature, the $I_{DS}$ applied to the respective pixel electrodes should increase. For that purpose, in an embodiment of the present invention, the K value is increased so as to increase the current $I_{DS}$ applied to the respective pixel electrodes 40 through the TFT. For example, in the case of a 15-inch XGA (pixel size is 99 μm×297 μm), the W/L is designed to be in a range of 8 through 10, so that the current $I_{DS}$ applied to the respective pixel electrodes 40 through the TFT increases.

When the W/L increases, the parasitic capacitance $C_g$ also increases as described above. For example, when the W/L of the TFT increases from 7 to 9, the parasitic capacitance $C_g$ increases from about 651 pF to about 774 pF. As described above, when the parasitic capacitance $C_g$ increases, the charge delay problem is generated and $\Delta V_p$ also increases, which causes deterioration in an image quality, such as flicker.

To overcome the problems due to the increase of the parasitic capacitance $C_g$, the present invention reduces the $C_{ST}$ to a predetermined extent so as to compensate for the influence due to the incremental increase of parasitic capacitance $C_g$. That is, the size of $C_{ST}$ is made to be inversely proportional to the W/L ration. For example, the $C_{ST}$, which has been about 230 fF in the related art, can be reduced to 190-210 fF. This can be achieved by reducing the amount of overlap between an end of the pixel electrode 40 and the adjacent gate line 60 (refer to FIG. 2).

To prevent an indefinite spot of low temperature, the present invention increases the W/L and reduces the $C_{ST}$ value so as to compensate for the influence of the incremental increase of the parasitic capacitance $C_g$ in the TFTs serving as switching devices provided in the respective pixels of the active matrix-type LCD. According to embodiments of the present invention, the W/L value is set to 9 and the $C_{ST}$ value is set to 200 fF, so that the indefinite spot of low temperature that might occur in the LCD can be prevented.

It will be apparent to those skilled in the art that various modifications and variations can be made in the a thin film transistor (TFT) of an LCD and a fabrication method thereof of the present invention without departing from the spirit or scope of the invention. Thus, it is intended that the present invention cover the modifications and variations of this invention provided they come within the scope of the appended claims and their equivalents.

What is claimed is:

1. A thin film transistor for an active matrix-type liquid crystal display comprising:
   a gate electrode that connects to a first gate line;
   a gate insulation layer on the gate electrode;
   a first semiconductor layer on the gate insulation layer;
   a second semiconductor layer divided into two parts facing each other on first and second portions of the first semiconductor layer;
   a source electrode overlapping the gate electrode and the first semiconductor layer and contacting one of the two parts of the second semiconductor layer;
   a drain electrode overlapping the gate electrode and the first semiconductor layer and contacting another one of the two parts of the second semiconductor layer, wherein the source and drain electrodes define a channel region in the first semiconductor layer having a length between the source and drain electrodes and a width the same as a width of at least one of the source and drain electrodes;
   a passivation layer on the source and drain electrodes and
   a pixel electrode electrically connected to the drain electrode, wherein an end of the pixel electrode overlaps a second gate line adjacent to the first gate line to form a storage capacitor having a storage capacitance,
   wherein the storage capacitance corresponds inversely proportional to the increment of the ratio of the width to the length (W/L) in the channel region for compensating a parasitic capacitance, wherein the width to the length (W/L) of the channel region is increased to have a range of 8 through 9 such that a parasitic capacitance is increased to have 774 pF, and a size of the overlapped portion between the pixel electrode and the second gate line is configured by expanding a portion where the end of the pixel electrode overlaps with part of the second gate line to reduce the storage capacitance of the storage capacitor in a range of 190 fF through 210 fF for compensating the increment of the parasitic capacitance and for preventing the occurrence of an indefinite spot of low temperature about 0° C., wherein a size range of the storage capacitance is selected to compensate for screen flicker due to an increase in the parasitic capacitance corresponding to an increment in the width to the length (W/L) ratio of the channel region, wherein a size of each pixel of the active matrix-type liquid crystal display is 99 μm×297 μm, wherein the storage capacitance is reduced to 200 Ff, wherein the second semiconductor layer has a higher dopant concentration than the first semiconductor layer, and wherein a length of the overlapped portion between the pixel electrode and the second gate line corresponds with a width of a pixel region corresponding with a distance between the data lines.

2. The thin film transistor according to claim 1, wherein the pixel electrode contacts the drain electrode through a drain contact hole formed in the passivation layer.

* * * * *